US012168839B2

(12) United States Patent
Weinert et al.

(10) Patent No.: US 12,168,839 B2
(45) Date of Patent: Dec. 17, 2024

(54) GROWTH OF A-B CRYSTALS WITHOUT CRYSTAL LATTICE CURVATURE

(71) Applicant: FREIBERGER COMPOUND MATERIALS GMBH, Freiberg (DE)

(72) Inventors: Berndt Weinert, Freiberg (DE); Frank Habel, Freiberg (DE); Gunnar Leibiger, Freiberg (DE)

(73) Assignee: Freiberger Compound Materials GMBH, Freiberger (DE)

( * ) Notice: Subject to any disclaimer, the term of this patent is extended or adjusted under 35 U.S.C. 154(b) by 0 days.

(21) Appl. No.: 16/842,810

(22) Filed: Apr. 8, 2020

(65) Prior Publication Data

US 2020/0232117 A1 Jul. 23, 2020

Related U.S. Application Data

(62) Division of application No. 15/559,446, filed as application No. PCT/EP2016/055956 on Mar. 18, 2016, now Pat. No. 10,662,549.

(30) Foreign Application Priority Data

Mar. 20, 2015 (DE) .................... 102015205104.8

(51) Int. Cl.
*C30B 29/40* (2006.01)
*C30B 25/02* (2006.01)
*C30B 25/08* (2006.01)
*C30B 25/18* (2006.01)

(52) U.S. Cl.
CPC .............. *C30B 25/08* (2013.01); *C30B 25/02* (2013.01); *C30B 25/183* (2013.01); *C30B 29/40* (2013.01); *C30B 29/406* (2013.01)

(58) Field of Classification Search
CPC ....... C30B 25/02; C30B 25/08; C30B 25/183; C30B 29/40; C30B 29/406
See application file for complete search history.

(56) References Cited

U.S. PATENT DOCUMENTS

| 6,176,925 B1 | 1/2001 | Solomon et al. |
| 7,879,147 B2 | 1/2011 | Xu et al. |
| 2002/0155712 A1 | 10/2002 | Urashima et al. |
| 2002/0175341 A1 | 11/2002 | Biwa et al. |

(Continued)

FOREIGN PATENT DOCUMENTS

| CN | 1618116 | 5/2005 |
| CN | 101657569 | 2/2010 |

(Continued)

OTHER PUBLICATIONS

Steinegger et al., "Precipitate engineering in GaAs studied by laser scattering tomography" Materials Science and Engineering B80 (2001) 215-219.*

(Continued)

*Primary Examiner* — Robert M Kunemund
(74) *Attorney, Agent, or Firm* — A.C. Entis-IP Ltd; Allan C. Entis

(57) ABSTRACT

A III-V-, IV-IV- or II-VI-compound single crystal comprising III-, IV- or II-precipitates and/or unstoichiometrical III-V-, IV-VI-, or II-VI-inclusions, wherein concentration of the respective precipitates and/or inclusions is no more than $1 \times 10^4 \, cm^{-3}$.

13 Claims, 1 Drawing Sheet

(56) References Cited

U.S. PATENT DOCUMENTS

| | | | |
|---|---|---|---|
| 2005/0166835 A1 | 8/2005 | Koukitsu et al. | |
| 2007/0141823 A1 | 6/2007 | Preble et al. | |
| 2008/0194085 A1 | 8/2008 | Sunkara et al. | |
| 2008/0203361 A1* | 8/2008 | Dutta | C30B 29/40 |
| | | | 438/460 |
| 2008/0203408 A1 | 8/2008 | Leibiger et al. | |
| 2009/0278136 A1 | 11/2009 | Beaumont et al. | |
| 2010/0139553 A1 | 6/2010 | Yoshida et al. | |
| 2012/0021163 A1 | 1/2012 | Leibiger et al. | |
| 2015/0050471 A1 | 2/2015 | Lipski et al. | |
| 2015/0292111 A1 | 10/2015 | Gründer et al. | |

FOREIGN PATENT DOCUMENTS

| | | | |
|---|---|---|---|
| CN | 102507584 | * | 6/2012 |
| DE | 102007009412 | | 8/2008 |
| DE | 102008063130 | * | 7/2010 |
| DE | 102012204551 | | 9/2013 |
| DE | 102012204553 | | 9/2013 |
| EP | 0967664 | | 12/1999 |
| EP | 2006028868 | * | 3/2006 |
| EP | 3010035 | | 4/2016 |
| JP | 02188912 | | 7/1990 |
| JP | 1990188912 | | 3/1992 |
| JP | 2003303774 | | 10/2003 |
| JP | 2015017030 | | 1/2015 |
| WO | 2007062250 | | 5/2007 |
| WO | 2008102358 | | 8/2008 |

OTHER PUBLICATIONS

Oberstor et al "Boron Contamination and Precipitation During the Growth of InP" journal of crystal growth 54 (1981) 443-448.*

Sinae Kim et al., Fabrication of fee-standing GaN by using thermal decomposition of GaN, Journal of Crystal Growth 398, 2014, pp. 13-17.

M. Naumann et al., Laser scattering experiments in VCz GaAs, Journal of Crystal Growth 210, 2000, pp. 203-206.

Tadashige Sato et al., Nearly 4-Inch-Diamter Fee-Standing GaN Water Fabricated by Hydride Vapor Phase Epitaxy with Pit-Inducing Buffer Layer, Japanese Journal of Applied Physics 52, 2013, 08JA08.

Th. Steinegger et al., Laser Scattering Tomography on Magnetic CZ-Si for Semiconductor Process Optimization, Solid State Phenomena vols. 108-109, 2005. pp. 597-602.

International Search Report and Written dated Dec. 13, 2016 for corresponding application No. PCT/EP2016/055956 filed Mar. 18, 2016.

German Office Action dated Oct. 28, 2015 for Application No. 102015205104.8 filed Mar. 20, 2015 (from the priority of the PCT International Application PCT/EP2016/055956).

Partial PCT International Search Report dated Jul. 11, 2016 for corresponding application No. PCT/EP2016/055956 filed Mar. 18, 2016.

Chinese Office Action dated May 20, 2019 for Application No. 201680017053.1 filed Mar. 18, 2016.

English Summary of Chinese Office Action dated Nov. 25, 2019 for Application No. 201680017053.1 filed Mar. 18, 2016.

Ye Zhizhen et al., Semiconductor Film Technology and Physics, Second Edition, Zhejiang University Press, 2nd Edition, Dec. 2014, pp. 106-107 (Chinese).

English Summary of the Third Party Opinion submitted on Aug. 30, 2019 in Japan against corresponding application JP2017549197 filed on Mar. 18, 2016.

Japanese Office Action, mailing date Feb. 4, 2020, for corresponding Japanese Application: JP2017549197 filed on Mar. 18, 2016.

Office Action dated Mar. 2, 2023 in corresponding patent application U.S. Appl. No. 17/846,043, filed Jun. 22, 2022.

Office Action dated Apr. 25, 2023 in corresponding European patent applciation 16 711234.1 filed Mar. 18, 2016.

Office Action dated Jul. 6, 2023 in corresponding patent application U.S. Appl. No. 17/846,043, filed Jun. 22, 2022.

Craig R. Barrett, The Principles of Engineering Materials, Published in 1973, pp. 65-85.

Peter Rudolph, Defect Formation During in Crystal Growth from the Melt, Springer Handbook of Crystal Growth, Springer 2010, pp. 159-200.

Peter Rudolph, Fundamentals and engineering of defects, Progress in Crystal Growth and Characterization of Materials 62 (2016) pp. 89-110.

* cited by examiner

GROWTH OF A-B CRYSTALS WITHOUT CRYSTAL LATTICE CURVATURE

RELATED APPLICATIONS

The present application is Divisional of U.S. application Ser. No. 15/559,446 filed on Sep. 19, 2017 now U.S. Pat. No. 10,602,549, which is a U.S. National Phase of PCT Application PCT/EP2016/055956, filed on Mar. 18, 2016, which claims the benefit under 35 U.S.C. § 119 (a)-(d) of German Patent Application 102015205104.8 filed Mar. 20, 2015, the disclosures of which are incorporated herein by reference.

FIELD OF THE INVENTION

The present invention relates to processes for the production of A-B single crystals on foreign or native substrates, wherein A-B single crystals mean III-V-, IV-IV- or II-VI compound semiconductor crystals. The processes according to the invention enable the production of A-B crystals with high quality, which are in particular suitable for the use as wafers.

BACKGROUND

Conventional processes for the production of A-B compound semiconductor crystals have in particular dealt with III-V-crystals; hereto, fundamentally different production processes exist. Special compound semiconductors, as e.g. GaAs, could be grown from the melt in the required crystalline perfectness. For crystals which are obtained far away from their melting point (e.g. SiC, GaN, AlN), it is only possible with difficulties to grow at most perfect crystals. For such crystals, a single crystal growth is only possible at temperatures at which a rearrangement of atoms is not possible any more for kinetic reasons. The crystallization energy which is released at such conditions is, however, so large in all crystallographic directions that the atoms growing to the present crystal are bound immediately to the crystal lattice in a relatively unordered manner, and therefore usually a polycrystalline or optionally even amorphous solid is obtained.

The crystal growth far remote from the melting point occurs therefore from solution or from gas phase. In practice, in particular gas phase deposition methods are applied for III-N-crystals. Herein, however, the problem occurs that offered substance concentrations are lower compared to the case when a growth would be performed from the melt. Therefore, the crystallization rate decreases compared to the crystal growth from a melt. Nevertheless, such crystals tend to the formation of polycrystals, as the crystal nucleus formation probability at crystal defects increases, and an ordered single crystal growth on the already present crystal is difficult.

"Perfectly" single crystalline areas, however, only grow from present few crystal defects and therefore can form macroscopically even areas and crystals in this way. Such a phenomenon can, for example, be observed for GaN-crystals from the Na-flux-method.

During the growth of such crystals from the liquid phase or gas phase, an increase of the diameter is further only hardly or even not possible at all. The growth therefore occurs often on respectively large-area foreign substrates, the lattice constants of which, however, in most cases do not correspond to the A-B crystal to be grown, which leads to bad crystal quality, tensions and cracks.

Possibilities to influence the curvature/tension of the growing crystals or templates have been often shown, for example, in the patent applications DE 10 2012 204 551 A1 and DE 10 2012 204 553 A1. For thin layers, the curvature can be measured very well with the measuring procedure of Laytec. With increasing crystal thickness in the range of μm, the measuring signal becomes very fuzzy, and the procedure is not applicable any more. In order to directly measure the curvature of the crystal during the growth process, this has to be realized by a direct optical (e.g. photos of the crystal in temporal succession in the visible wavelength range or the X-ray wavelength range) or mechanical measuring procedures (e.g. absolute or relative determination of the geometric position from the middle to the edge of the growing crystal). As a result, the changing curvature/deflection of the crystals in the middle of the crystal related to the edge of the crystal can be obtained, e.g. for a GaN crystal on a 2" sapphire template during HVPE crystal growth.

A further disadvantage of the conventional process for the production of compound semiconductor crystals, which are not obtained from the melt, can be seen in a low growth rate, which is caused by the low concentration of the species to be crystallized from the upper surrounding liquid or gas phase.

In U.S. Pat. No. 7,879,147 B2 it is differentiated between a "2D" and "3D"-growth of GaN. Here, a template with at least 50% pit area with at least $10^2$ pits/$cm^2$ is mentioned. Furthermore, it can be seen in FIGS. 9b and 9d that the pits grow in a thin area, and are closed subsequently.

US 2009/0 278 136 A1 is based on the direct growth on a substrate, wherein islands, which are initially not connected with each other, are grown. However, nothing is disclosed about the coalescence of the islands.

WO 2008/102 358 A2 includes a "wetting layer", in which or on which a crystalline layer grows.

US 2008/0 194 085 A1 discloses an applied Ga-film, which subsequently transfers to GaN and therefore disappears.

In the "Japanese Journal of Applied Physics 52" (2013), Sato and Goto write that a pit-layer thickness should be >3 μm. However, FIG. 3 only discloses a "3D" layer thickness of 2 μm.

In the "Journal of Crystal Growth 398" (2014) Kim et al. write that free-standing GaN wafers can be produced with high crystal quality, by forming a decomposable buffer layer (DBL) and a capping layer (CPL) above a substrate. Because of the CPL, a GaN-wafer can easily separate from a substrate. By the decomposition of the DBL, a metallic film can be formed on the surface of the DBL during wafer growth, which contains Ga.

Also U.S. Pat. No. 6,176,925 B1 discloses a liquid metal film, which can react with the Si-substrate. The III-N-layer grows on the liquid film.

In a process according to DE 10 2007 009 412 A1, In is added as auxiliary substance. In is herein directly added to the Ga source and, like Ga, undergoes a chlorination in the process.

Typical problems of conventional processes of the state of the art can be seen in the fact that no relatively thick crystal layers can be obtained, and that in particular cracks, inclusions, precipitates and other material defects can form, which can limit the material quality and the processability to substrates.

SUMMARY OF THE INVENTION

Therefore, it was an objective technical problem of the present application to grow a preferably perfect single crystal at a temperature $T \leq T_s$ ($T_s$=melting point of the substance) on a support, which either is composed of the same material as the crystal to be grown, or, however, is different or physically and chemically not identical.

This objective technical problem is solved by the processes according to claims 1, 3 and 7. A highly preferable product, which can be obtained according to the invention, is defined in claim 10. Further developments are contained in the respective dependent claims.

Without limiting the invention, a synopsis of items shall be presented in the following, which describe the products, further developments and special features of the present invention:

(1) Process for the production of a III-V-, IV-IV- or II-VI-compound semiconductor crystal, wherein the process comprises the following steps:
  a) providing a substrate, which optionally comprises a crystal layer (buffer layer) of the semiconductor crystal to be grown, in a crystal growth reactor;
  b) providing a gas phase above the substrate provided according to a) optionally comprising a buffer layer, the gas phase comprising at least two reactants of the elements for the compound semiconductor (II, III, IV, V, VI), which reactants are gaseous at a reaction temperature in the crystal growth reactor and are reactive with each other at the chosen reaction conditions, wherein the reactants may be derive from a reaction of suitable III-, IV- or II-precursor or element and V-, IV-, or VI-precursor or element,
    wherein the ratio of the concentrations of two of said reactants is adjusted such that the compound semiconductor crystal can crystallize from the gas phase, and wherein at least one co-reactant is present in the gas phase, which can react with at least one III-, IV- or II-reactant or precursor or element;
  c) deposition of the compound semiconductor crystal on a surface of the substrate optionally comprising a buffer layer, wherein the gas phase provided according to b) contains during at least one deposition phase of step c) such an amount of at least one of the precursor compounds or the elements, i.e. the concentration is selected that high, that always enough starting materials can be provided in order to enable a growth of crystals, wherein by adding or adjusting of a reducing agent, which reduces the III-, IV- or II-compound respectively, and of co-reactant the activity of the III-, IV- or II-compound in the gas phase is decreased, so that the growth rate of the crystal is lower compared to a state without co-reactant, but the semiconductor crystal growth is not terminated.

(2) Process according to item 1, wherein the provision according to b) and the deposition according to c) during the deposition phase allows the formation of an elementary metal of the III-, IV- or II-element, preferably of a liquid metal film on the surface of a crystal growth zone of the compound semiconductor. In contrast to U.S. Pat. No. 6,176,925 B1, the liquid metal film is present on the surface of a crystal growth zone.

(3) Process for the production of a III-V-, IV-IV- or II-VI-compound semiconductor crystal, wherein the process comprises the following steps:
  a) providing a substrate, which optionally comprises a crystal layer (buffer layer) of the semiconductor crystal to be grown, in a crystal growth reactor;
  b) providing a gas phase above the substrate provided according to a) optionally comprising a buffer layer, the gas phase comprising at least two reactants of the elements for the compound semiconductor (II, III, IV, V, VI), which reactants are gaseous at a reaction temperature in the crystal growth reactor and are reactive with each other at the chosen reaction conditions, wherein the reactants may be derive from a reaction of suitable III-, IV- or II-precursor or element and V-, IV-, or VI-precursor or element,
    wherein the ratio of the concentrations of two of said reactants is adjusted such that the compound semiconductor crystal can crystallize from the gas phase, and wherein at least one co-reactant is present in the gas phase, which can react with at least one II-, III- or IV-reactant or precursor or element;
  c) deposition of the compound semiconductor crystal at the surface of the substrate optionally comprising a buffer layer,
    wherein the gas phase provided according to b) during at least one deposition phase of step c) includes such an amount of at least one of the precursor compounds or the elements, i.e. the concentration is selected that high, that always enough starting materials can be provided to enable a growth of crystals, wherein adding or adjusting of a reducing agent, which reduces the III-, IV- or II-compound respectively, allows the formation of an elementary metal of the III-, IV- or II-element, preferably of a liquid metal film on the surface of a crystal growth zone of the compound semiconductor.

(4) Process according to one of the previous items, wherein the compound semiconductor is selected from the group consisting of GaN, AlN, $Ga_{1-x}Al_xN$ (0<x0<1), GaAs, GaP, InP, GaSb, SiC, CdTe, ZnTe and HgTe.

(5) Process according to one of the previous items, wherein the II, III or VI-precursors are selected from the group consisting of GaCl, $GaCl_3$, AlCl, $AlC_3$, InCl, $InCl_3$, GaI, $GaI_3$, InI, $InI_3$, $SiCl_yH_{4-y}$ (wherein 0≤y≤4, wherein y is an integer number), $CH_4$, $CCl_4$, $CH_zCl_{(4-z)}$ (wherein z=1, 2 or 3), simple or higher silanes, simple or higher germanes and simple or higher hydrocarbons and/or the V-precursors are selected from the group consisting of $NH_3$, $AsH_3$, and $PH_3$.

(6) Process according to one of the previous items, wherein the reduction of a III-, IV- and/or II-precursor to the respective III-, IV- or II-element is allowed by the addition or adjustment of hydrogen.

(7) Process according to items 2, 3 or 6, wherein the concentrations of the at least one co-reactant influences both the thermodynamic equilibrium of the compound semiconductor growth (EQ1) and the thermodynamic equilibrium of the reduction of a reactant (EQ2).

(8) Process according to one of the previous items, wherein one or more gaseous auxiliary substance(s) are delivered into the gas phase, which is/are isoelectronic with regard to the semiconductor crystal and which is/are maximally incorporated into the compound semiconductor in amounts of maximally $1 \times 10^{17}$ $cm^{-3}$, preferably maximally $5 \times 10^{16}$ $cm^{-3}$ at the selected conditions of the growth reactor.

(9) Process according to one of the previous items, wherein the auxiliary substance is reduced to reduced auxiliary substance by the presence or adjustment of hydrogen.

(10) Process according to one of the last two previous items, wherein the auxiliary substance is an In-compound, preferably InCl or $InCl_3$, and the reduced auxiliary substance is In.

(11) Process for the production of an A-B-crystal, wherein A is at least one element of the third (III), fourth (IV) or second (II) main/sub group of the periodic table of elements, selected from Cd, Zn, Hg, Al, Ga, In, Si, C and Ge and wherein B is at least one element of the V-, IV- or VI-main/sub group of the periodic table of elements, selected from C, Ge, N, P, As, Sb, S, Se, Te, wherein the process comprises the following steps:

providing a substrate, which optionally comprises an A-B-buffer layer;

ii) growing of an A-B-layer in an epitaxial "3D" growth mode above the substrate which optionally comprises an A-B-buffer layer, wherein the substrate or the optional buffer layer comprises surfaces which are not perpendicular to the desired total growth direction, whereby a structured surface with elevations and subjacent gaps between elevations is formed;

iii) filling of the gaps between the elevations obtained from step ii) by growing or depositing of further A-B-material for obtaining a smooth surface above the substrate, and iv) growing of further A-B-layer on the smooth surface obtained by iii) in an epitaxial "2D"-growth mode, wherein at least step ii), optionally also steps iii) and/or iv) are performed in presence of one or more auxiliary substance(s), which is/are different from the present III-, IV- or II-element or the given semiconductor compound, but is/are isoelectric thereto, wherein providing and depositing during the deposition phase allows the formation of an elementary metal of the III-, IV- or II-element in the form of a liquid metal film on the surface of the crystal growth zone of the compound semiconductor.

(12) Process according to item 11, wherein step ii) and optionally step iii) and/or iv) is/are performed according to the process according to item 1 step b) and c) or according to item 3 step b) and c), preferably according to a process according to one of the items 2 or 4 to 10.

(13) Process according to item 11 or 12, wherein the chemical activity of the A-Cl$_x$-compound generated in the gas phase is influenced by the addition of Cl$_2$ and/or HCl to the gas phase.

(14) Process according to item 13, wherein a liquid layer, which comprises A, is formed on the growing A-B-layer by reduction of at least one of the precursors of component A.

(15) Process according to one of items 11 to 14, wherein a liquid phase comprises III-, IV- or II-elements of A.

(16) Process according to one of the previous items 11 to 15, wherein A-B means GaN, and the auxiliary substance is indium or an indium compound in this case.

(17) Process according to one of items 11 to 15, wherein A-B means AlN and the auxiliary substance is indium or gallium or an indium-, a gallium- or an indium/gallium-compound in this case.

(18) Process according to one of items 11 to 17, wherein in step iii), preferably also in step (iv), a lateral ("2D")-crystal growth is obtained by increasing the temperature and/or an increase of the A/B-ratio.

(19) Process according to one of the previous items 11 to 18, wherein the obtained filling layer does not comprise pores.

(20) Process according to one of the previous items, wherein in step ii) the rough surface is characterized by at least one of the following surface structure properties:

V-pits, inverse-pyramidal pits or other pits or other surfaces not proceeding perpendicular to the growth front; a pyramidal structure, a trapezoidal structure, a prism structure at the surface of crystallites, wherein possible areas do not have to be atomically smooth.

(21) Process according to the previous item, wherein) a rough, in particular V-pit-comprising surface is generated in step ii) by beginning/admitting an A-B growth only at defined areas over the substrate obtained in step i) which optionally comprises a buffer layer, wherein an A-B growth in other areas is prevented.

(22) Process according to item 21, wherein the partially admitted and partially prevented growth is obtained by generating a geometrically repeating or not repeating, centric or lateral structure on the substrate, above the substrate obtained in step i) which optionally comprises a buffer layer in a targeted manner.

(23) Process according to items 21 or 22, wherein the partially admitted and partially prevented growth is obtained by partially passivating the substrate obtained in step i), which optionally comprises a buffer layer.

(24) Process according to the three previous items, wherein the partial passivation is generated in a targeted manner by applying open geometrical structures/layers, on which no growth can occur.

(25) Process according to item 21, wherein the partially admitted growth is obtained, because naturally generated openings in a thin layer are present in which the growth can occur.

(26) Process according to item 23, wherein the partial passivation is generated in a targeted manner in the atomic scale via using of intrinsic inhomogeneities, in particular atomic steps, tensions, dislocation distributions/arrangements on which no growth can occur.

(27) Process according to item 21, wherein the partially admitted growth is obtained by generating atomic steps (off-orientation), favouring the preferred growth of the new substance at certain positions of the support and preventing it at other positions.

(28) Process according to item 21, wherein the partially admitted growth is obtained by a storing or positioning of external (further substance) or internal (further phase of the substrate) areas in the support in the atomic or macroscopic scale, on which the new substance cannot crystalize, wherein external areas are defined via a further substance and internal areas are defined via a further phase of the support.

(29) Process according to one of the previous items 11 to 28, wherein at least one of the following conditions is selected for the "3D"-growth mode of step ii), compared with the respective conditions for the "2D"-growth mode of step iv):

lower growth temperature compared to the "2D"-growth mode, higher N/III-ratio compared to the "2D"-growth, for example via a higher NH$_3$-concentration.

(30) Process according to one of the previous items 11 to 29, in particular if III-N means GaN, wherein for the "3D"-growth mode of step ii) a first relatively low temperature in the range of 700-850° C., and for the "2D"-growth mode of step iv), a second, compared to the first temperature relatively high temperature in the range of around 900-1050° C. is selected, and wherein in step iii) a temperature between the first and the second temperature is selected or the temperature is increased accordingly from the "3D" to the "2D" growth temperature.

(31) Process according to item 30, wherein the temperature is gradually increased from the first to the second temperature in step iii) to fill the recesses compared to a middle growth front with material without holes.

(32) Process according to one of the previous items 11 to 31, wherein in step ii) the "3D"-layer is brought to, measured from the support on which the layer is precipitated to the highest point, from around 50 to 500 μm, preferably 100 to 150 μm, and in step c), this obtained thickness is not or only maximally increased by 100 μm, preferably maximally 30 μm, before this thickness is further increased in form of the "2D"-layer in step iv), preferably remarkably increased.

(33) Process according to one of the previous items 11 to 32, in particular the previous item, wherein in in step iv) the previously obtained thickness is increased by at least 100 μm, preferably at least 500 μm, further preferably at least 1 mm and in particular preferrably at least 5 mm, 1 cm, 2 cm, 5 cm or at least 10 cm.

(34) Process according to one of the three previous items, wherein III-N-material grows or precipitates mainly in the gaps between the elevations in step iii).

(35) Process according to one of the items 11 to 29 and 32 to 34, wherein A-B is GaN, AlN, CdTe or SiC.

(36) Process according to one of the previous items, wherein it is performed in an HVPE-setup.

(37) Single crystal comprising, in particular—besides optionally present other traces or dopants—consisting of, III-V-, IV-IV- or II-VI-compound crystal, wherein the concentration of the respective III-, IV- or II-precipitates and/or unstoichiometrical III-V-, IV-VI-, or II-VI-inclusions in the III-V-, IV-IV-, or II-VI-crystal is maximally $1 \times 10^4$ cm$^{-3}$, preferably maximally $1 \times 10^3$ cm$^{-3}$, further preferably maximally $1 \times 10^2$ cm$^{-3}$.

The determination or measurement of the mentioned precipitates and inclusions should be performed so that all technical relevant characteristics of the precipitates and inclusions can be captured (i.e. small size, large size and optionally also medium size); a suitable method herefore is, for example, the laser scattering tomography (shortly LST), as e.g. described by M. Naumannn et. al., "*Laser scattering experiments in VCz GaAs*" J. of. Crystal Growth 210 (2000) 203-206, and Steinegger et. al., "*Laser Scattering Tomography on Magnetic CZ-Si for Semiconductor process Optimization*" Solid State Phenomena Vols. 108-109 (2005) pp. 597-602).

(38) Single crystal according to item 37, wherein besides the III-V-, IV-IV- or II-VI-basic crystal additionally at least analytically detectable traces of an auxiliary substance are present, which indicate the use of the auxiliary substance during the production.

(39) Single crystal according to item 38, wherein the auxiliary substance is present in a maximal concentration of $1 \times 10^{17}$ cm$^{-3}$, preferably $5 \times 10^{16}$ cm$^{-3}$.

(40) Single crystal according to items 38 or 39, wherein the auxiliary substance is indium.

(41) Single crystal according to one of items 38 to 40, wherein the traces of the auxiliary substance are neither present in the form of precipitates or inclusions of the auxiliary substance, nor in the form of the respective compound mixed crystal, which would be formed by the reaction of the auxiliary substance with an element or precursor of the components building the crystal.

(42) Single crystal according to one of items 37 to 41 without curvature of the crystal lattice or with a crystal lattice-curvature radius of at least 10 m, preferably at least 15 m, further preferably at least 20 m.

(43) Single crystal according to one of items 37 to 41 without curvature of the crystal lattice or with a crystal lattice-curvature radius of at least 25 m.

The auxiliary substance serves as surface-active substance during the crystal growth and therefore influences the surface reconstruction. Although the auxiliary substance is not substantially incorporated into the respective crystal (in particular at the III-, IV- or II-positions) at the chosen growth conditions (in particular the chosen growth temperatures) of the respective III-V-, IV-IV- or II-IV-compound crystal, the energy barrier for the diffusion of atoms of the respective compound partner decreases (i.e. respectively the V-, IV- or VI-atom). The auxiliary substance causes a more rapid temporal adaptation of the lattice constant at constant growth rate, leading to higher forces and deflections of the crystal. However, it simultaneously leads to an improvement of a lateral growth and to less scattering centres in the crystal, which could act as crack seeds. Accordingly, crystals with a stronger deflection grow, which are relatively strongly strained, but comprise less cracks. In this case, the curvature of the crystal relatively increases by using the auxiliary substance.

Particularly peculiar aspects of the present invention related to the auxiliary substance can be seen in that, firstly, the auxiliary substance could be used—optionally, however very preferably—during the formation of the liquid metal film, and that, secondly, the auxiliary substance could be used in the step of the 3D-growth mode and could develop an unexpected, favourable effect there.

In this sense, the presence of the auxiliary substance provides an indication (a quality feature) for its use in the peculiar aspects of the present invention.

The incorporation of the auxiliary substance into the respective crystal is, as mentioned, not substantial; nevertheless, if the auxiliary substance is used, its presence should be analytically determinable at least in traces—by a respective detection method which is specific for the auxiliary substance. The auxiliary substance is thereby not present in the form of inclusions or precipitates, but is incorporated—due to the thermal conditions, for the mentioned reasons, no more than marginally—isoelectronically at the respective sites of the compound semiconductor crystal. The amount incorporated into the crystal is usually below an usual amount for classical dopings, for example in a maximum concentration of $1 \times 10^{17}$ cm$^{-3}$, preferably $5 \times 10^{16}$ cm$^{-3}$.

DETAILED DESCRIPTION

Figure 1:
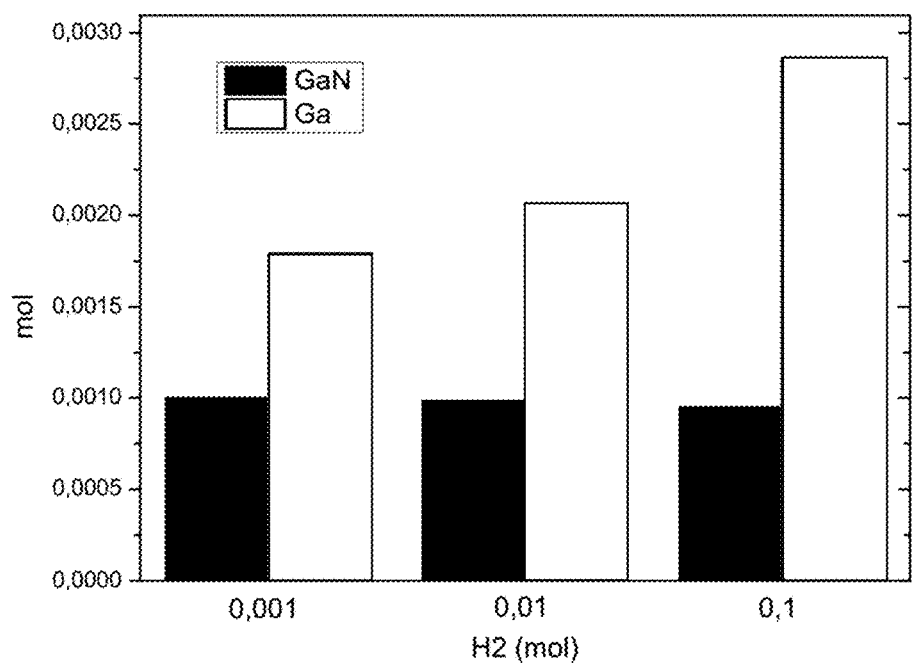
FIG. 1 describes molar numbers of Ga and GaN existing in thermochemical equilibrium at increasing hydrogen concentrations.

The basic concept of the underlying invention is based on the fact that a system of equilibrium reactions coupled with each other is generated, which are adjusted to an equilibrium condition dependent on the boundary conditions, when no substances are led in or led out of the reactor and all basically possible reactions of the coupled equilibrium reactions are reversible, i.e. when insofar in sum no reactions occur for which only one reaction direction is possible under the boundary conditions. Several equilibrium reactions coupled with each other are included in the entire chemical system. Herein, below at first equilibrium reactions connected with each other shall be presented, which are connected via two common reactants, what is shown in this case for the example of GaN, which is representative and only exemplary for a III-V-crystal to be formed and respectively stands for analogous IV-IV- or II-VI-crystals. In the example described here, Ga is representative for III- or IV- or II-reactants, and Cl$_2$ (or HCl) is representative for co-reactants, and H$_2$ is representative for reduction means and reducing agents (in particular gaseous ones), respectively related to III, IV or II. In the following, only the primary equilibria are described.

Equilibrium reaction 1:

$$2Ga + Cl_2 \leftrightarrows 2GaCl$$

$$\text{or } 2Ga + 3Cl_2 \leftrightarrows 2GaCl_3 \tag{EQ1}$$

Ga reacts with $Cl_2$ to GaCl (at higher temperatures) or to $GaCl_3$ (at lower temperatures) and therefore is present mainly as GaCl at the given process conditions (≥800° C.). By the additional over-stoichiometric addition of $Cl_2$ or HCl, the GaCl is stabilized, whereby the activity (a) of GaCl or $GaCl_3$ is lowered, and it therefore reacts more slowly, which is particularly important for the formation of GaN, cf. reaction 3a.

For a desired GaN-formation probability/growth rate, the GaCl-concentration can/must be increased in the case of an addition of HCl and constant $NH_3$-concentration. This is important to avoid a Ga-depletion of the gas phase in the vicinity of the surface during the GaN-growth, which is why an improvement of the crystallinity of the crystal to be grown is obtained.

Alternatively, the equilibrium reaction 2 can occur, in which HCl reacts instead of $Cl_2$:

Equilibrium reaction 2:

$$2Ga + 2HCl \leftrightarrows 2GaCl + H_2$$

$$\text{or } 2Ga + 6HCl \leftrightarrows 2GaCl_3 + 3H_2 \tag{EQ2}$$

The adaptation of the $H_2$-partial pressure is important, since the hydrogen in turn is in equilibrium with other substances present and therefore influences other equilibria.

GaCl can, by means of the gaseous reduction means or reducing agent (here: $H_2$), be converted into Ga and HCl, and can therefore lead to a Ga-film—significant and advantageous for the inventive process—on the substrate and in particular on the crystal to be grown. The concentration of further reactants at the phase boundary of the crystal to be grown can be increased by the liquid film, to conditions of a solution growth. The layer thickness of the liquid phase can, however, be kept thin or extremely thin, suitably in the lower μm or even nm range, even to atomic dimensions.

In the following, further reactions shall be described, which are, however, no equilibrium reactions and only proceed in one direction (i.e. are irreversible) under the given conditions, whereby, however, the above-described basic equation system can be further influenced, as described after the presentation of the further reactions:

Reaction 3a:

$$GaCl + NH_3 \rightarrow GaN + HCl + H_2$$

$$\text{or } GaCl_3 + NH_3 \rightarrow GaN + 3\,HCl \tag{3a}$$

GaCl can react with $NH_3$ up to temperatures of approximately 1150° C. and maximally 1 atm, however the compound is decomposed into its elements at higher temperatures when the pressure in the system is not increased. A back-reaction is, however, not possible, as a formation of $NH_3$ is energetically unfavourable.

Reaction 3b:

$$2GaN + Cl_2 \rightarrow 2GaCl + N_2 \text{ or}$$

$$2GaN + 2HCl \rightarrow 2GaCl + N_2 + H_2 \tag{3b}$$

A decomposition of GaN via etching with $Cl_2$ as well as HCl is possible, a back-reaction is, however, not possible, as a formation of $NH_3$ is energetically unfavourable.

Furthermore, two further side reactions are possible in principle:

$$2GaN + H_2 \rightarrow 2GaH + N_2 \tag{4a'}$$

$$2GaN + H_2 \rightarrow 2GaNH \tag{4a''}$$

For both reactions 4a' and 4a", however, no thermodynamic data and experimental proof are available.

The formation of GaN from Ga and $NH_3$ is also possible:

$$2Ga + 2NH_3 \rightarrow 2GaN + 3H_2 \tag{4b}$$

In principle, a decomposition without influence of Cl and H can further occur:

$$2GaN(s) \rightarrow N_2(g) + 2Ga(l) \tag{5}$$

(the terms "s" denote solid, "g" denote gaseous, and "l" denote liquid)

Besides GG2, potentially additional liquid gallium could also be generated by this reaction, which can occur at temperatures above 830° C.

In all equations (equilibrium reactions+irreversible reactions), the elements Ga, Cl and H are present and influence the equilibria, therefore, a separation of the respective equations is not possible without further ado. Via a targeted adjustment of the concentrations of H and Cl in the system, e.g. via partial pressures of the reactants $H_2$ and $Cl_2$ for the respective reaction temperatures, desired equilibrium concentrations and III/N-ratios, it is however possible to influence the various equilibria individually in a desired direction, e.g. in the direction of the product side in GG2 for the advantageous formation and adjustment of a liquid Ga-film on the crystal surface. Also the concentration of HCl can be adjusted in a well-aimed manner, although the concentrations of H and Cl are changed in this case in an equivalent ratio, which is why the adjustability is limited.

Reactions 3, 4 and 5 are irreversible reactions; back-reactions to $NH_3$ do not occur under the existing boundary conditions, and finally the active atomic nitrogen cannot be available any more. Nevertheless, the irreversible reactions influence the adjustment and the position of the equilibrium reactions via respective reaction kinetics.

The equilibrium reactions GG1 and GG2 can be influenced and/or adjusted in a targeted manner via the addition or adjustment of reduction means ($H_2$) or reducing substance and/or co-reactant(s) ($Cl_2$, HCl) in the reaction zone.

All agents/substances which are able to convert other substances (here e.g. GaCl) into their components or into other compounds are to be understood, from a thermodynamic point of view, as reduction means or reducing substances; here, they themselves react with the substance to be reduced (e.g. GaN). It is inter alia determined by the thermochemical potential of the substances, their amounts and the temperature whether a reducing effect can originate from substances.

Via addition or adjustment of reduction means/agents, in particular the ratio of GaN to liquid Ga is influenced or controlled. Furthermore, $H_2$ or co-reactant(s) ensure that the activity of Ga or Ga-containing reactant(s) in the gas phase is decreased. Furthermore, $H_2$ or co-reactant(s) ensure that reaction 3a does not proceed too fast despite high concentrations of the precursor compounds (GaCl, $GaCl_3$ and/or $NH_3$), but does not come to a standstill either. A preferably high concentration of the III-precursor (here: GaCl, $GaCl_3$) and V-precursor (here: $NH_3$) is of particular importance, as then enough starting materials can always be provided at a preferably selectable high growth rate of GaN, to ensure a growth of crystals with high quality. Given the presence of a liquid Ga-film, this high concentration is directly available at the phase interface area.

In contrast to the system described by Kim (Journal of Crystal Growth 398 (2014)), in which solid GaN is intended to be decomposed for the intended removal of the GaN-buffer layer, it is possible in the present invention to form "new" precursors by a reaction with liquid Ga (cf. Eq. EQ1 and EQ2), e.g. via addition or adjusting of $Cl_2$, HCl or locally sufficient concentrations of $Cl_2$ and HCl in the growth zone, so that these are available directly at the phase interface area. In contrast to Kim, liquid Ga is therefore available in the suitable equilibrium all the time for a further reaction, depending on the equilibrium conditions.

Isoelectronic auxiliary substances, which are optionally, but preferably used, such as In during the formation of GaN, can also react with co-reactants analogous to the other reactants. Auxiliary substances can also be formed and therefore can be provided in a liquid phase above the compound semiconductor crystal as it grows.

In the present system, preferably the direct decomposition of GaN (eq. 5) shall be avoided; liquid Ga shall better be present only in an equilibrium concentration via a coupling of the above-mentioned equilibrium reactions.

For the thin liquid metal film on the surface of the growth zone and its importance for the crystal growth, e.g. the following phenomena can be exemplarily determined according to the invention:

(i) When the GaCl-addition is interrupted for analytical investigation reasons, only the delivered additional HCl is effective in the phase boundary, and therefore favours an etching of the Ga-film. Thereby, the crystal is immediately bent excessively and forms cracks or even, in the worst case, bursts into many single pieces. Such a reaction cannot be reasoned by changes in characteristics in the inner part of the crystal; for those reasons it is the only possible explanation that the liquid film present on the surface is etched, and the surface tension is therefore abruptly changed, which leads to the described spontaneous cracking or bursting of the crystal.

(ii) The surface cannot tear during $NH_3$-addition and a termination of the addition of GaCl and HCl at a certain temperature, however V-pits in a size of e.g. 5 to 10 μm may form. V-pits are formed if the III/V(N)-ratio becomes very small, what is inevitably the case in the described process. If, however, no Ga-film was present, the growth would abruptly terminate, and the surface would be practically perfectly smooth.

(iii) Further, inclusions and precipitates can be avoided which would form without the presence of a liquid film by local concentration differences during the crystal growth.

In the liquid metal film, also a further component can be present as an auxiliary substance, as e.g. In, as described above.

Liquid layers (e.g. of Ga, In or other elements), which are permanently present (during crystal growth) above the crystal, influence the mobility of atoms. The incorporation at energetically preferred positions and therefore on crystallographically exact positions is favoured, which is why the system moves closer to and approaches the equilibrium state.

For III-V-, IV-IV- or II-VI-compound semiconductor crystals different from GaN, the formation of the compound semiconductor proceeds analogously by means of corresponding equilibrium reactions, wherein the position of the equilibria can in turn be influenced by irreversible side reactions.

During growing of AlN, for example, Al is transformed into $AlCl_3$ at approximately 600° C., and is converted with $NH_3$ to AlN at 1400° C. to 1600° C. Here, at the above-described boundary conditions, the III/V-ratio is close to 1 or even higher, but should be at least 1/50.

For the advantageous and preferred use of an auxiliary substance during growth of an AlN-crystal, according to the invention also the particular of the apparatus containing an additional In-source and/or Ga-source may exist, which forms gaseous InCl or GaCl with HCl or $Cl_2$, which is also led to the crystallization front face. It then forms, analogously to the above-mentioned GaN, a liquid In- or here also Ga-layer mixed with liquid Al at the crystallization front on the growing AlN-crystal.

For GaAs, an arrangement can be selected such that the substrate is, for example, a GaAs-LEC substrate (fabricated according to the Liquid Encapsulated Czochalski process) with dislocation densities of $5 \times 10^4$ to $3 \times 10$ cm$^{-2}$. Onto this, GaCl/GaCl$_3$ and $AsH_3$ are delivered in a temperature range of e.g. 650° C. to 850° C. and allowed to react. Analogous to the previous arrangements, InCl/InCl$_3$ is inserted into the system in order to form a liquid In-film on the GaAs.

For GaP, an arrangement can be selected such that the substrate is e.g. a GaAs-substrate (e.g. fabricated as LEC-GaAs) with dislocation densities of $5 \times 10^4$ to $3 \times 10^5$ cm$^{-2}$. On this, InCl/InCl$_3$ and $PH_3$ are inserted and allowed to react, for example in a temperature range of 850° C. to 1050° C. For the advantageous and preferred employment of an auxiliary substance for growing of the GaP-crystal, there is a peculiarity according to the invention to insert an auxiliary substance like indium, e.g. by using of InCl/InCl$_3$, into the system, in order to form a liquid In-film with Ga above the GaP, analogous to the previous arrangements.

In a preferred embodiment with regard to the general process, the pressure in the reactor should be 100 mbar to 100 atm, preferably 1 atm or more, and best 10 atm or more. In order to obtain high gas phase concentrations, a pressure of at least 1 atm is preferred.

The reaction temperature should be preferably in the range of 450° C. to 1,200° C., further preferably as high as possible, approximately at least 1,000° C., e.g. 1,050° C., wherein the absolute temperatures are influenced dependent on the pressure and the chemical composition of the gas atmosphere.

However, it should be ensured that the atomic nitrogen partial pressure derived from the $NH_3$ is lower than the GaN-decomposition pressure. The problem occurring here in the case of nitrides resides in that this is, in a strict sense, no "real" equilibrium partial pressure, as the atomic nitrogen immediately reacts to molecular nitrogen without being available any more for a back-reaction; this term therefore represents a pure GaN-decomposition rate against vacuum.

The hydrogen concentration should be at least 30 mole-%, for example approximately 50 mole-%, up to maximally approximately 80 mole-%.

The III/V- or II/VI-ratio should be from 1 to 1/1000, usually 1/10 to 1/100, preferable is, however, a value of 1/10 or higher.

Regarding the amount of $Cl_2$, which is required for the material transport and which has preferable effects on the formation of the equilibrium, approximately the double, maximally however the three-fold amount of $Cl_2$ required for the formation of GaCl should be used.

The growth rate can be further influenced by the total gas flow amount, wherein however also the geometry of the arrangement and device set-up has an effect on the development of the growth rate. Further, the growth rate is dependent on axial and radial temperature gradients, reactor materials and gas compositions.

Basically it should be ensured that epitaxial growth takes place, which means that the crystal structure of the support is continued within the growing crystal, independent of whether it is the same or a different substance. A crystal growth respectively occurs with quantitatively added co-reactants, e.g. halogens (Cl, I, Br) or bound halogens (HCl, HI, HBr). Halogens or halogen compounds are added in excess (over)stoichiometric concentrations, leading to an improvement of the crystal quality, as a concentration decrease deriving from the crystallization front can be avoided as far as possible. In this case, simultaneously the growth rate of the growing crystal decreases, dependent on the required concentration of III, IV, or II.

Hydrogen is added in order to be able to reduce the precursor (optionally also an optional auxiliary substance) to elementary metal or to the respective element. Thereby, a liquid phase can be formed on the crystal to be grown and thereby increases the atomic mobility of the atoms. If the layer thickness of the liquid phase is low or even only extremely low—as made feasible by influencing the boundary conditions of the above-described reactions—the growth rate either decreases unsubstantially or only undiscernably due to diffusion limitation directly above the compound semiconductor crystal. A proof for the presence of a liquid phase can either be provided directly or indirectly.

Thermochemical equilibrium calculations have shown that when Ga(Cl) and atomic nitrogen come into contace in similar amounts, they react to GaN under GaN growth conditions. Here, a reaction with hydrogen cannot be shifted in a direction towards liquid Ga, as $NH_3$ is merely stabilized and the formation of GaN is suppressed, whereby GaCl und $NH_3$ are further present in the gas phase.

The liquid phase Ga, however, is present in thermochemical equilibrium calculations at suitable temperatures (e.g. at 900° C.) besides the solid GaN, when GaCl is in equilibrium with little atomic nitrogen, which can be made feasible directly at the phase boundary. If hydrogen is then added to the system, the amount of GaN is reduced and the amount of Ga increases (cf. FIG. 1).

FIG. 1 describes the molar numbers of Ga and GaN existing in thermochemical equilibrium at increasing hydrogen concentrations ($10^{-3}$ to $10^{-1}$ mole). Here, the amount of GaN remains almost the same, however the amount of Ga strongly increases caused by the fact that GaCl reacts with hydrogen to HCl and Ga. Thereby, the existence of the liquid phase Ga at 900° C. besides the solid GaN in the thermochemical equilibrium with increasing hydrogen concentrations is demonstrated.

A co-reactant is further added in such a composition that side reactions with at least one precursor in the gas phase occur above the provided substrate, whereby the formation probability of the crystal to be grown decreases, while the crystal quality is however increased thereby.

The above described reactions for the production of III-V-, IV-IV- or II-VI-compound semiconductor crystals can basically be performed in an HVPE-arrangement or set-up, wherein however the conditions are adapted as respectively described.

In the following, it shall be described in more detail how a combination of different "3D" and "2D" growth for the formation of crack-free crystals according to the invention is made possible, wherein in a further preferred embodiment for the "3D"-growth, optionally and preferred also for the filling of the "3D"-gaps and for the "2D"-growth, the above-mentioned embodiment with the controlled (equilibrium) reactions is applied.

The preferred/required surfaces of the crystal during the "3D"-growth essentially consist of crystal planes growing non-parallel to the general/total growth direction.

The desired/required surface of the crystal during the "2D"-growth essentially consists of crystal planes growing perpendicular to the general/total growth direction of the crystal. It should be noted that the surfaces in the growth direction of the semiconductor crystal to be grown during the "2D"-growth are essentially atomically smooth, however elevations in the micrometer-to millimeter range are possible. When an auxiliary substance is added as described above, it stabilizes a liquid phase present on the growing surface, but is essentially not reactive, i.e. it does essentially not form a chemically crystalline compound with one of the other compounds under the selected conditions. By contrast to possibly conventionally considered use of an auxiliary substance, it is not or not only used in the "2D"-growth mode according to this invention, but also or at least in the "3D"-growth mode, optionally in addition during filling of the gaps. This inventive approach has unexpectedly led to significant improvements in the obtained crystal.

In the "3D"-growth, the dislocations originally being perpendicular to the crystal growth direction are bent to the inclined crystal planes being not parallel to the general/total crystal growth direction and can, when these crystal planes grow towards adjacent crystal planes, annihilate without generating additional tensions, deflections or cracks in the crystal. During the "3D"-growth, a higher mobility of the reactants analogous to the "2D"-growth is generated during the presence of liquid phase on the surface of the crystal, resulting in an acceleration of the described processes.

On a substrate provided according to step i) of this embodiment, firstly a multitude of, preferably crystallographically similar, crystals are deposited (step (ii) of this embodiment) and coalesce (are combined) to a compressively strained layer.

During growth on a foreign substrate, the crystal lattice of the substance to be grown does not correspond to the substrate. The growing crystals are therefore created with zero-, one- or two-dimensional defects for obtaining an adaptation to the substrate.

Here, inclined crystal surfaces with regard to the growth direction can favour moving/pushing of defects of the single crystals to the edge of the crystallites, where the defects can annihilate with other defects.

Auxiliary substances such as e.g. In support this process, as the bending of the defects can be accelerated. Further, the auxiliary substances are intended to increase the surface mobility of the elements to be crystallized. The auxiliary substances are thereby intended to be incorporated only partially or not at all into the new crystal.

On the compressively strained layer of the substance to be grown, as many identically arranged crystals as possible are deposited, wherein however the crystal growth occurs on the surfaces perpendicular to the macroscopic growth direction, i.e. a lateral growth on the area perpendicular to the growth direction continues to occur. Since the lateral growth perpendicular to the growth direction, however, is lower compared to the growth in the growth direction, no or only an insufficient overgrowing of defects on the crystal surface occurs, and inclined growth areas in the "3D"-growth mode are formed in contrast to a perpendicular desired growth plane to the total crystal growth. As the crystal defects bend to the crystal surface, they move in the direction of these surfaces inclined to the general/total growth direction and react there with the defects of the other adjacent inclined surfaces at the areas which lie lower relative the crystal peaks.

With regard to the steps i) to ii), it is noted that the "3D"-growth conditions only start at selected atomic positions, e.g. at dislocation piercing points, atomic crystal steps and lattice defects of any kind. The crystallites growing faster in the growth direction compared to the perpendicular direction do not further grow on other crystal defects on the original surface. The same is true for the adjacent crystallites. The initially individually growing crystallites contact each other and finally cover the whole original layer and form a macroscopically rough three-dimensional surface, which consists of areas which are inclined, but are not perpendicular to the growth direction.

Here, the compressive tension of the crystal is generated and built up further. Herein, the dislocations move in finite times through the growth areas positioned inclined to the growth direction out of the crystallite to the surface and annihilate with the defects of the other crystallites which abut the crystallite.

However, this growth must not be confused with the growth on "macroscopic" structurings (e.g. ELO)/coverages on the substrate in the µm-range, which exclude the "3D"-growth process on these covered areas, whereby the "3D"-growth only starts in the areas lying in between, as described above, and then the covered areas are laterally overgrown by the "3D"-crystallites.

For the realization of step iii) of the preferred embodiment, other conditions (e.g. high temperatures) can now be adjusted, which avoid a new nucleation and at the same time allows that the remaining defects are moved/pushed to the edge of the crystallites over the still inclined areas, which increasingly direct their direction perpendicular to the growth direction, in the shortest time possible, so that they can annihilate there with the defects of the facing inclined area. This occurs via the filling of the gaps obtained during the "3D"-growth mode.

This filling of the three-dimensional growth areas in the direction of two-dimensional growth therefore preferably takes place such that potentially existing defects between the almost defect-free crystallites do not any more or only marginally locally and temporarily change or shift; thereby, no new tensions are generated.

For this purpose, e.g. the growth rate in the period of the filling/closing of the "3D"-surface (step iii)) is initially kept lower compared to the later growth rate of the main crystal growth, and the temperature is then step-wise increased towards the "2D"-growth temperature, until the latter is reached. Alternatively or additionally to the temperature increase, a change of the III/V-ratio or the pressure would be possible.

Subsequently, in step iv) of the preferred embodiment, crystal in the "2D"-growth mode is continued to be deposited.

The auxiliary substances (e.g. In), which are added to the system from the beginning, can assist this process, but have to be isoelectronic with regard to the bulk crystal and must not substantially be incorporated into the crystal e.g. in the form of a mixed crystal or a new phase (inclusions or the like). For example, in the system In for GaN, In atoms may be incorporated only into the crystal on Ga positions. If this embodiment is combined with the above described embodiment, auxiliary substances can however contribute to the formation of the elementary metallic liquid phase. The auxiliary substance(s) such as e.g. In is/are preferably not incorporated or detectable, maximally only up to a concentration of only $1\times10^{17}$ cm$^{-3}$, preferably maximally $5\times10^{16}$ cm$^{-3}$, measured via e.g. secondary ion mass spectroscopy.

Also during the growing of crystals which are different from GaN, the liquid phase plays an important role during the "2D"- and "3D"-growth.

Accordingly, the liquid In- and/or Ga-layer for the growing of AlN is not only used in the "2D"-growth of the AlN-crystal, but also in the "3D"-growth of AlN, whereby an adaptation of the AlN-crystal lattice can occur without macroscopic deflection of the substrate, shaped by the originally foreign or native substrate onto the AlN-crystal lattice being in equilibrium under the current growth conditions. Subsequently, analogously to GaN the "3D"-AlN-layer is filled/closed and is overgrown under "2D"-growth conditions with higher temperatures compared to "3D", such that the crystal finally reaches the desired thickness.

A similar principle is applied for the growth of GaAs, where a liquid Al-layer is used, and for the growing of GaP where a liquid In-layer is used.

Disturbing precipitates or unstoichiometric inclusions can be avoided or reduced by the described process, like e.g. III-precipitates or unstoichiometric III-V-inclusions, as well as analogously II- or IV-precipitates or II-VI- or IV-IV-inclusions.

The inventive limitation or avoidance of such precipitates or inclusions is then respectively detectable in the inventive single crystal, e.g. measurable and verifiable via LST (laser scattering topography) (Laser scattering experiments in VCz GaAs, M. Naumannn et. al., J. of Crystal Growth 210 (2000) 203-206; Laser Scattering Tomography on Magnetic CZ-Si for Semiconductor process Optimization, Steinegger et. al. Solid State Phenomena Vols. 108-109 (2005) pp. 597-602). In the case of a crystal with precipitates or unstoichiometric inclusions—not according to the invention —, this is distinguished from mixed crystals such that an auxiliary substance is substantially not incorporated into a III-V-, II-IV- and IV-IV-crystal, as it would be in the case of conventional mixed crystals, such as for example GaN (and respectively forming a GaInN-mixed crystal, for example, with In), but deposits as a separate phase. In contrast thereto, neither a mixed crystal of the auxiliary substance with the compound crystal is present in the inventive crystal, nor does the auxiliary substance form a separate phase.

The III-V-, IV-IV-, or II-VI-compound single crystal according to the present invention respectively comprises a concentration of III-, IV- or II-precipitates and unstoichiometric III-V-, IV-IV- or II-VI-inclusions of maximally $1\times10^4$ cm$^{-3}$, preferably maximally $1\times10^3$ cm$^{-3}$, even more preferably maximally $1\times10$ cm$^{-3}$.

The III-V-, IV-IV-, or II-VI-compound single crystal according to the present invention is further characterized in that no or only a small crystal lattice curvature or a crystal lattice curvature radius of at least 10 m, 15 m, 20 m or preferably 25 m deflection radius, is present.

Here, the crystal lattice curvature of the grown GaN-crystal is e.g. determined by X-ray measurements at room temperature, wherein the orientation at least at the edge and in the middle of the crystal or of the thus produced wafer is determined.

The local and temporal curvature of the template or crystal is checked by means of optical or mechanical processes at/during the HVPE-crystal growth at growth temperature. Herein, the optical processes can be performed by image-sensing with different wavelengths or even with X-rays. The mechanical processes determine, e.g. in direct contact with the crystal to be grown, the different local and temporal positions in relation to a defined "zero position".

The methods used here can determine the distance at points or in areas, or can be imaging techniques.

Figure 2:
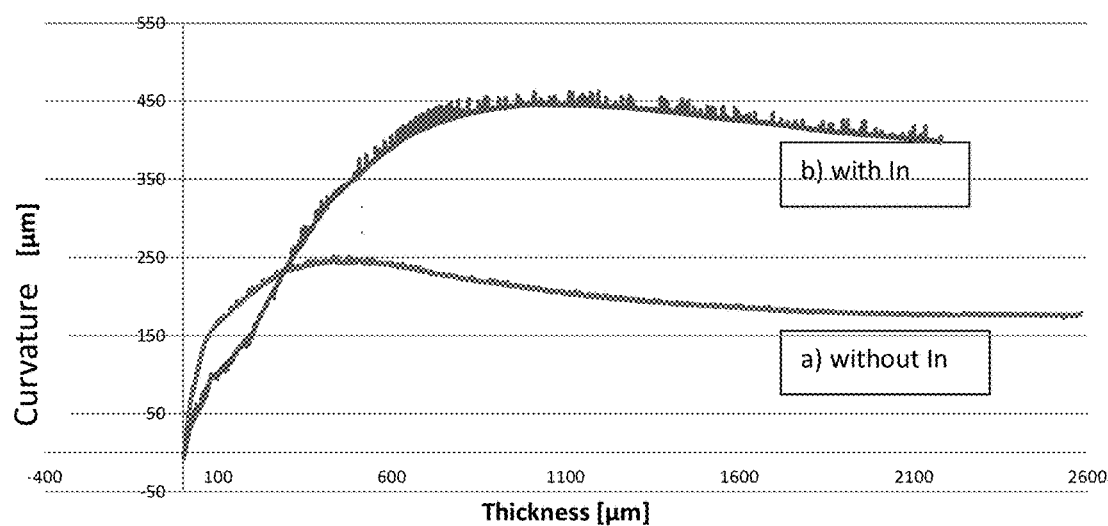
FIG. 2 shows influence of an auxiliary substance on the curvature/bending of a growing crystal.

FIG. 2 shows the influence of an auxiliary substance on the curvature/bending of the growing crystal, exemplified by Indium as auxiliary substance during the growth of a GaN-crystal. The value of the curvature relates to the middle of the crystal in relation to the crystal edge for a GaN-crystal on a 2"-sapphire template during the HVPE-crystal growth. FIG. 2a) shows the curvature when using standard conditions (without In), and FIG. 2b) shows the curvature for a process with In as auxiliary substance at HVPE-GaN-growth temperature.

As shown in FIG. 2, when using indium as auxiliary substance the curvature of the crystal increases. Indium acts as surface-active substance during 2D-crystal growth. Although Indium is not incorporated substantially (replacing Ga-positions) into the GaN-crystal at the chosen GaN-growth temperatures, the energy barrier for the diffusion of nitrogen atoms decreases. The In causes a more rapid temporal adaptation of the lattice constant at constant growth rate, leading to higher forces and deflections of the crystal and thereby to higher susceptibility for cracks. It, however, simultaneously leads to an improvement of a lateral growth and to less scattering centres in the crystal, which could act as crack seeds. In this way, crystals grow with a stronger deflection, which are relatively strongly tensed, but comprise less cracks.

In summary, the present invention relates to a process for the production of III-V-, IV-IV- or II-VI-compound semiconductor crystals.

The process starts with providing of a substrate with optionally one crystal layer (buffer layer). Subsequently, a gas phase is provided, which comprises at least two reactants of the elements of the compound semiconductor (II, III, IV, V, VI) which are gaseous at a reaction temperature in the crystal growth reactor and can react with each other at the selected reactor conditions. The ratio of the concentrations of two of the reactants is adjusted such that the compound semiconductor crystal can crystallize from the gas phase, wherein the concentration is selected that high, that crystal formation is possible, wherein the activity of the III-, IV- or II-compound in the gas phase is decreased by adding or adjusting of reduction means and of co-reactant, so that the growth rate of the crystals is lower compared to a state without co-reactant. Therein, the compound semiconductor crystal is deposited at a surface of the substrate, while a liquid phase can form on the growing crystal.

Further, auxiliary substances can be added, which can also be contained in the liquid phase, but are only incorporated into the compound semiconductor crystal in low amounts.

Herein, 3D- and 2D-growth modes can be controlled in a targeted manner, wherein present defects in a crystal are pushed to the edge of the crystallites in utmost short time over the still inclined surfaces in a 3D-growth modus, which continuously change their direction perpendicular to the growth direction, so that they can annihilate there with defects of the facing inclined area.

The addition of auxiliary substances and the presence of a liquid phase favour these means.

The product is a single crystal of the respective III-V-, IV-IV- or II-VI-compound semiconductor crystal, which, compared to respectively conventional compound semiconductor crystals, has a lower concentration of inclusions or precipitates and nevertheless has no or only a very low curvature.

The invention claimed is:

1. A III-V binary compound single crystal comprising III precipitates wherein concentration of the respective precipitates is no more than $1 \times 10^4$ cm$^{-3}$, wherein the single crystal is selected from the group consisting of GaN, AlN, GaP, InP.

2. The single crystal according to claim 1, wherein the concentration of the respective precipitates is no more than $1 \times 10^2$ cm$^{-3}$.

3. The single crystal according to claim 1 further comprising an analytically detectable trace of an auxiliary substance indicating use of the auxiliary substance during production of the single crystal.

4. The single crystal according to claim 3, wherein the auxiliary substance is indium.

5. The single crystal according to claim 3, wherein the auxiliary substance is present in a concentration of no more than $1 \times 10^{17}$ cm$^{-3}$.

6. The single crystal according to claim 3, wherein the auxiliary substance is present in a concentration of no more than $5 \times 10^{16}$ cm$^{-3}$.

7. The single crystal according to claim 3, wherein the trace of the auxiliary substance is neither present in the form of precipitates of the auxiliary substance, nor formed by a reaction of the auxiliary substance with an element or precursor of the components building the single crystal.

8. The single crystal according to claim 3, wherein the auxiliary substance is isoelectrically incorporated into the single crystal.

9. The single crystal according to claim 1, having a crystal lattice with no curvature.

10. The single crystal according to claim 1, having a crystal lattice-curvature radius of at least 10 m.

11. The single crystal according to claim 1, having a crystal lattice-curvature radius of at least 15 m.

12. The single crystal according to claim 1, having a crystal lattice-curvature radius of at least 20 m.

13. The single crystal according to claim 1, having a crystal lattice-curvature radius of at least 25 m.

* * * * *